(12) United States Patent
Shieh et al.

(10) Patent No.: US 8,187,929 B2
(45) Date of Patent: May 29, 2012

(54) MASK LEVEL REDUCTION FOR MOSFET

(75) Inventors: Chan-Long Shieh, Paradise Valley, AZ (US); Fatt Foong, Goleta, CA (US); Gang Yu, Santa Barbara, CA (US)

(73) Assignee: CBRITE, Inc., Goleta, CA (US)

( * ) Notice: Subject to any disclaimer, the term of this patent is extended or adjusted under 35 U.S.C. 154(b) by 55 days.

(21) Appl. No.: 12/612,123

(22) Filed: Nov. 4, 2009

(65) Prior Publication Data

US 2011/0104841 A1  May 5, 2011

(51) Int. Cl.
*H01L 21/84* (2006.01)
(52) U.S. Cl. .. 438/158; 438/149; 438/738; 257/E21.414
(58) Field of Classification Search ............... 438/149, 438/158, 736–738; 257/E21.414
See application file for complete search history.

(56) References Cited

U.S. PATENT DOCUMENTS

| | | | | |
|---|---|---|---|---|
| 5,478,766 A | * | 12/1995 | Park et al. | 438/158 |
| 2008/0002086 A1 | * | 1/2008 | Misaki et al. | 349/44 |
| 2009/0146150 A1 | * | 6/2009 | Hosoya | 257/59 |

FOREIGN PATENT DOCUMENTS

WO    WO2009120551    * 10/2009

OTHER PUBLICATIONS

WO2009120552 (attached herewith).*

* cited by examiner

*Primary Examiner* — Matthew Landau
*Assistant Examiner* — Candice Chan
(74) *Attorney, Agent, or Firm* — Parsons & Goltry; Robert A. Parsons; Michael W. Goltry

(57) ABSTRACT

A method of fabricating a thin film transistor for an active matrix display using reduced masking operations includes patterning a gate on a substrate. A gate dielectric is formed over the gate and a semiconducting metal oxide is deposited on the gate dielectric. A channel protection layer is patterned on the semiconducting metal oxide overlying the gate to define a channel area and to expose the remaining semiconducting metal oxide. A source/drain metal layer is deposited on the structure and etched through to the channel protection layer above the gate to separate the source/drain metal layer into source and drain terminals and the source/drain metal layer and the semiconducting metal oxide are etched through at the periphery to isolate the transistor. A nonconductive spacer is patterned on the transistor and portions of the surrounding source/drain metal layer.

14 Claims, 7 Drawing Sheets

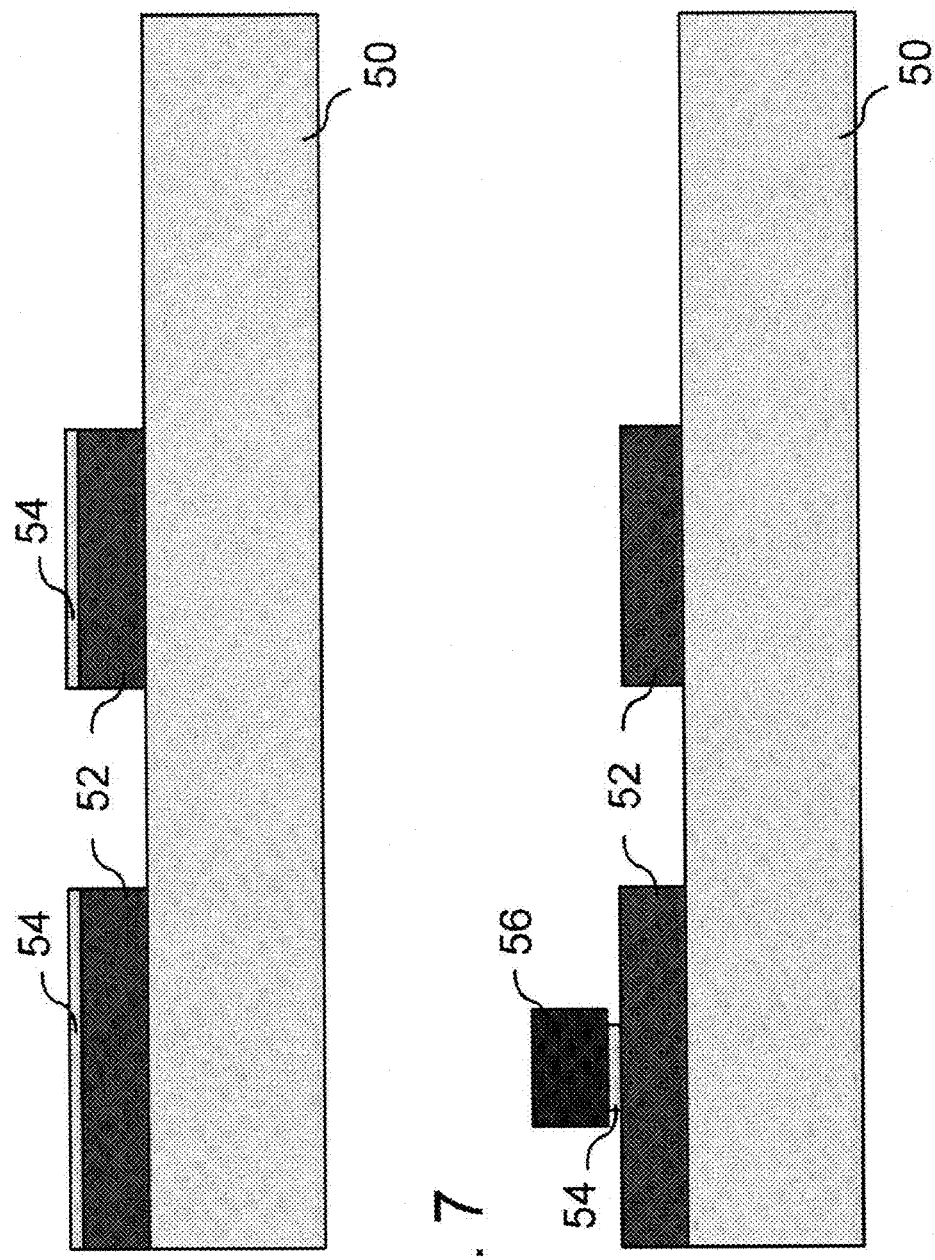

MASK LEVEL REDUCTION FOR MOSFET

FIELD OF THE INVENTION

This invention generally relates to a process in which the number of masks is reduced in active matrix production.

BACKGROUND OF THE INVENTION

In active matrix liquid crystal displays (AMLCD) and active matrix organic light emitting displays (AMOLED), there are requirements of conductive layers for different functionalities. For example, a metal layer is needed for the scan line and another metal layer is needed for the data line. These two lines cross over each other and cannot be formed during the same metal level steps. The conductivity of the metal lines for the data and scan lines is very critical and cannot be made from relatively low conductivity transparent material because of the conductivity requirement. Also, a transparent conductive layer is needed as the electrode for transmissive LCDs or bottom emitting OLEDs. It is not easy to combine or form the transparent conductor with the other metal lines. Each of the metal lines needs to be patterned in separate lithographic steps and contributes to the number of mask levels. Also, in the fabrication of AMLCDs and AMOLEDs there is another mask level, used in the formation of a spacer (in the case of an AMLCD), or a bank (in case of an AMOLEDs). It will be understood that banks or spacers are used to separate various layers in a complete display, e.g. a backplane from an emission layer. Each mask level in a process adds to the complexity and cost of the process.

It would be highly advantageous, therefore, to remedy the foregoing and other deficiencies inherent in the prior art.

Accordingly, it is an object of the present invention to provide a new and improved fabrication process for AMLCDs and AMOLEDs in which the number of mask levels is reduced.

SUMMARY OF THE INVENTION

Briefly, to achieve the desired objects of the instant invention in accordance with a preferred embodiment thereof, provided is a method of fabricating a thin film transistor for an active matrix display with reduced masking operations. The method includes the step of providing a substrate with a surface and patterning gate metal on the surface of the substrate to define a thin film transistor gate (the first mask level). A layer of gate dielectric is formed over the gate and surrounding substrate surface and a layer of semiconducting metal oxide is deposited on the layer of gate dielectric. A channel protection layer is patterned on the semiconducting metal oxide overlying the gate. The channel protection layer is patterned to define a channel area in the semiconducting metal oxide above the gate and to expose the remaining semiconducting metal oxide (the second mask level). At least a layer of source/drain metal layer is deposited on the channel protection layer and the exposed semiconducting metal oxide. A single etching step includes etching through the source/drain metal layer to the channel protection layer above the gate to separate the source/drain metal layer into thin film transistor source and drain terminals and etching through the source/drain metal layer and the semiconducting metal oxide at the periphery to isolate the thin film transistor (the third mask level). A nonconductive spacer layer is deposited on the isolated thin film transistor and the surrounding source/drain metal layer and etched to define a light transmission area adjacent the thin film transistor and to expose a transparent electrode in the light transmission area (the fourth mask level).

The desired objects of the instant invention are further achieved in a method of fabricating a pair of interconnected thin film transistors for an active matrix display with reduced masking operations. The method includes providing a substrate with a surface and patterning gate metal on the surface of the substrate to define two spaced apart thin film transistor gates. A layer of barrier metal is formed over the gates and a via mask is patterned on the surface of the barrier metal above one of the gates to define a via. The via mask is used to protect the barrier metal from etching and anodization to form a via. The via mask is reflowed to cover the via sides and the metal of the gates is anodized to define a layer of anodized metal at the surface of the gates. The via mask is removed to expose the via. A channel and source/drain terminals are formed in association with each of the gates and the one of the gates is connected through the via to the source/drain terminals of the other gate.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIGS. 7 through 11 are simplified sectional views illustrating sequential steps in a process for fabricating vias in an active matrix display.

DETAILED DESCRIPTION OF THE DRAWINGS

As explained briefly above, a metal layer is needed for scan lines and another metal layer is needed for data lines. Also, an additional mask level is used in the formation of a spacer for AMLCDs and a bank for the formation of AMOLEDs. By combining the S/D metal level mask and the additional mask, the necessary transparent conductor for LCDs or OLEDs can be formed without using an additional mask. Eliminating the mask level substantially improves the process and reduces cost. The process in which the mask level is eliminated is set forth in detail below.

Figure 1:
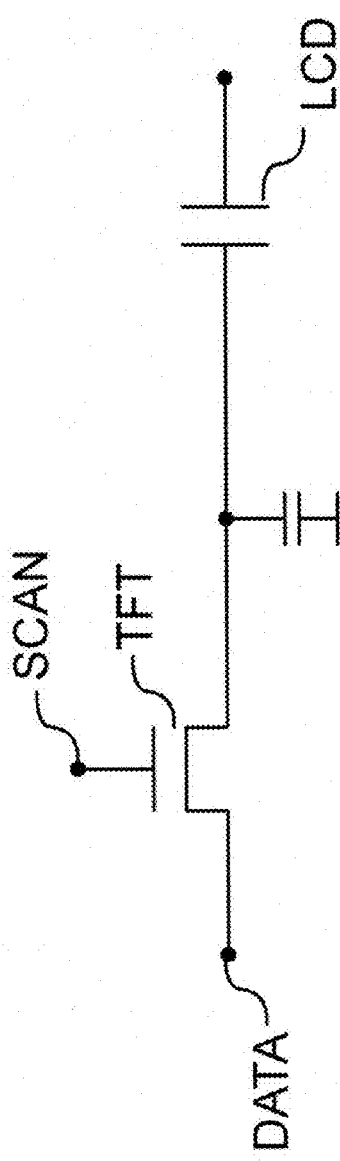
FIG. 1 is a schematic representation of a single LCD element in an active matrix liquid crystal display (AMLCD)

Referring specifically to FIG. 1, a schematic diagram of a typical single element in an AMLCD is illustrated. The single element includes an LCD, a storage capacitor and a thin film transistor (TFT) driver. The TFT is activated or controlled by a scan line connected to the gate and a data line connected to the source/drain (S/D) terminals. While other variations of an AMLCD element may be available, all variations generally require separate scan lines and data lines and a transparent conductor. In addition to being used for AMLCD, the pixel driving circuit shown in FIG. 1 can also be used for driving EPD and for pixel readout in a 2D image array.

Figure 2:
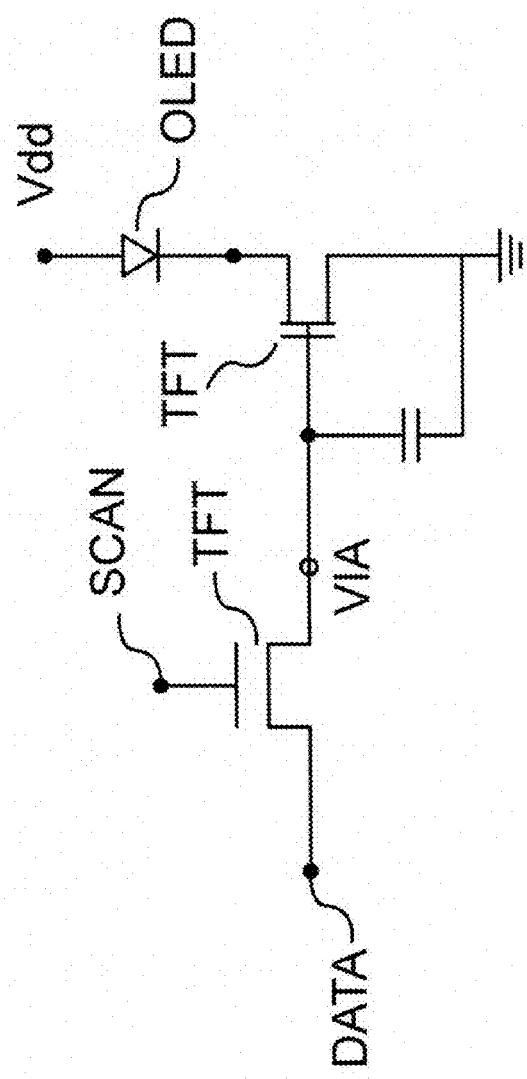
FIG. 2 is a schematic representation of a single OLED element in an active matrix organic light emitting display (AMOLED)

Referring specifically to FIG. 2, a schematic diagram of a typical single element in an AMOLED is illustrated. The single element includes an OLED, a storage capacitor and (in this example) a thin film transistor (TFT) controller and a TFT driver. The TFT controller is activated by a scan line connected to the gate and a data line connected to the source/drain (S/D) terminals. While other variations of an AMOLED element may be available, all variations generally require separate scan lines and data lines and interconnecting transistors and a transparent conductor.

Figure 3:
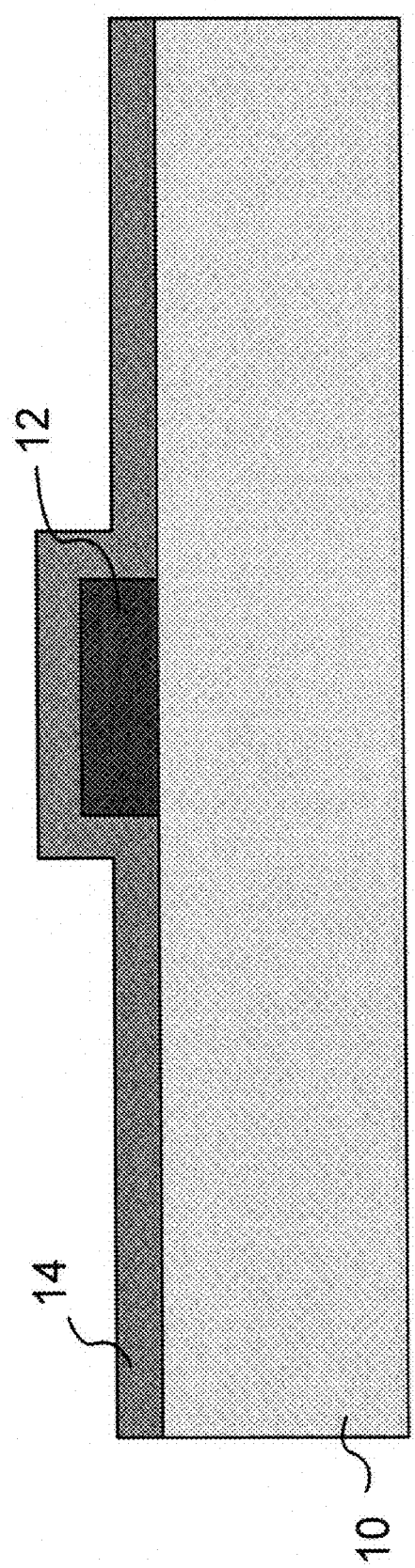
FIGS. 3 through 6 are simplified sectional views illustrating sequential steps in a process for fabricating an active matrix display.

Turning now to FIG. 3, a substrate 10 is provided which may be any material desired for the specific application, e.g. plastic, glass, etc. As a first step in the preferred process, gate metal layer 12 is patterned onto the surface of substrate 10 to form a gate for the TFT. The patterning of gate metal layer 12 requires the first mask level. In a second step of the process a gate dielectric layer 14 is deposited on gate metal layer 12 and the surrounding surface of substrate 10. No fine mask level is required for the deposition of gate dielectric layer 14 since it is substantially a blanket deposition. Note that while a single thin film transistor (TFT) is illustrated in the steps depicted in FIGS. 3-6 for simplicity, it should be understood that a complete array of LCDs or OLEDs in AMLCDs or AMOLEDs, respectively, is being fabricated.

Figure 4:
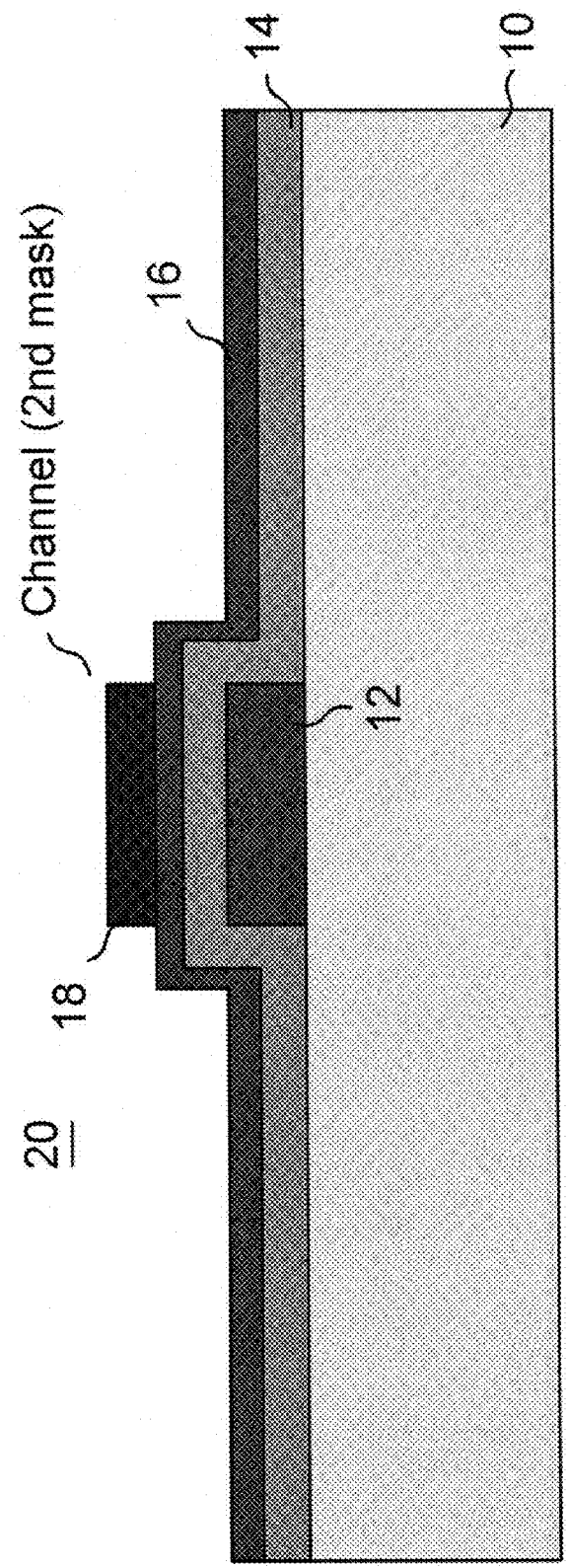

Turning to FIG. 4, a semiconducting metal oxide layer 16 is deposited on gate dielectric layer 14. No fine mask level is required for the deposition of semiconducting metal oxide layer 16 since it is substantially a blanket deposition. A channel protection layer 18 is patterned on top of metal oxide layer 16 and in overlying relationship to gate 12 to substantially define the channel of the thin film transistor, hereinafter referred to as transistor 20. The formation and positioning of channel protection layer 18 requires the second mask level.

Figure 5:
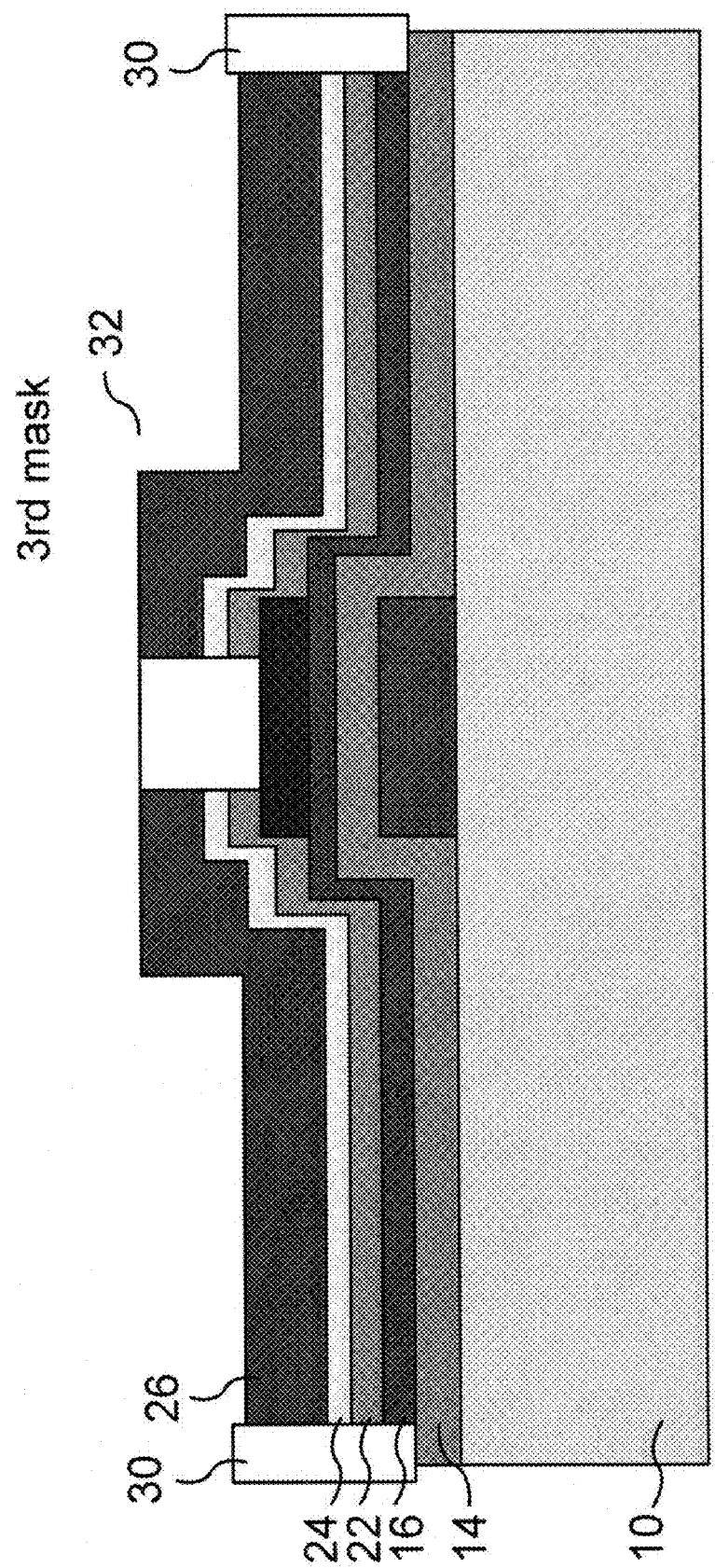

Turning to FIG. 5, an optional layer 22 of transparent oxide conductor is deposited on metal oxide layer 16 and an optional barrier metal layer 24 is deposited on the surface of layer 16. The transparent oxide conductor of layer 22 may be, for example, ITO or the like and the barrier metal may be, for example, Mo, W, Cr, Ni, etc. A source/drain (S/D) metal layer 26 is deposited over barrier metal layer 24. Layer 26 of S/D metal may be any convenient conductive metal, such as aluminum or the like. It will be understood that layers 22 and 24 are optional and depend generally upon the application and the specific type of materials used in the various layers. No fine mask level is required for the deposition of layers 22, 24 and 26 since each is substantially a blanket deposition.

The multiple layer stack, including layers 22, 24 and 26 (or the specific layers present), is then patterned by the S/D mask, or the third mask level. In this step an etch mask is used and the etching goes through layers 22, 24 and 26 to channel protection layer 18 above gate 12 and through layers 22, 24 and 26 and metal oxide semiconductor 16 elsewhere (designated 30). The result of this etch is a TFT designated 32. The etching 30 outside the channel achieves the isolation of metal oxide semiconductor layer 16 from adjacent components. As illustrated by the schematic representations of FIG. 1 and/or 2, gate metal layer 12 is generally connected to a scan line of the matrix and S/D metal layer 26 is connected to a data line of matrix and to additional components of the display element.

Figure 6:
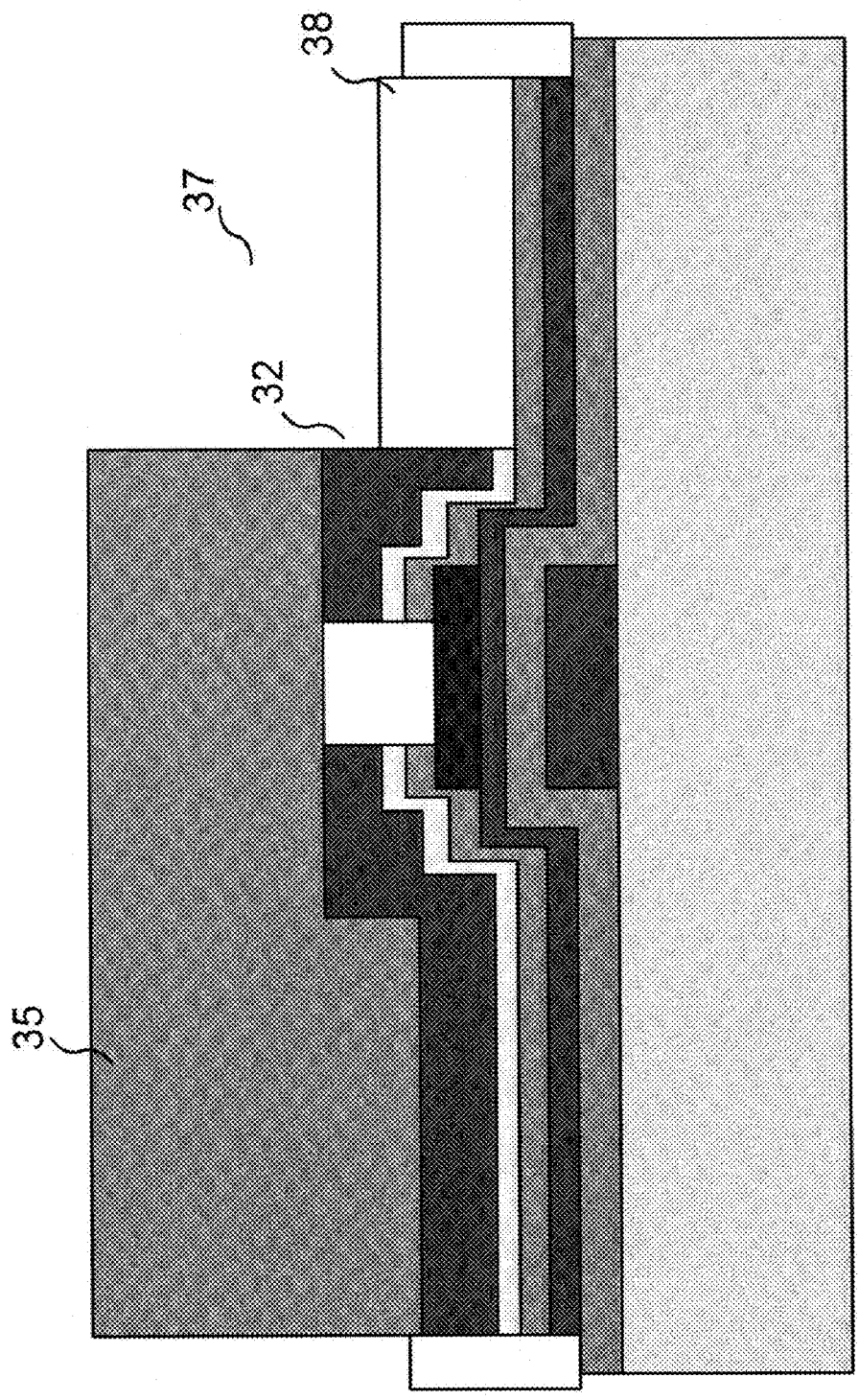

Turning now to FIG. 6, a spacer or bank layer 35 is patterned (the fourth mask level) on TFT 32 and portions of the surrounding source/drain metal layer. Optionally, the spacer or bank layer 35 is used as a patterning or etching mask to etch away the opaque S/D metal 26 and optional barrier metal 24 in an area designated 37 to be a light transmission (i.e. display) area. This optional step is used, for example in transparent displays or bottom emission/reflective displays. A transparent electrode, consisting of an optional transparent conductor layer 38 is deposited in area 37 on top of semiconducting metal oxide layer 16. It will be understood that without optional transparent conductor layer 38, semiconducting metal oxide layer 16 can serve as the transparent electrode. One advantage of transparent conductor layer 38 is that the material (e.g. TCO or the like) is generally relatively hard compared with the semiconducting metal oxide layer and thus forms a good contact pad for the connection of column and row driving circuits or the like.

Thus, three masks are used to pattern or fabricate TFT 32 and the spacer patterning is shifted from the color filter side to the TFT side in this specific embodiment. The spacer provides a fixed gap for LED filling. This shift in spacer position saves one mask level.

Referring to FIGS. 7-11, a process is illustrated for fabricating the two TFTs and a via therebetween in an AMOLED element (illustrated schematically in FIG. 2). Traditionally the gate dielectric is created by deposition and a via is created by etching. In the present process the gate metal is anodized into an insulating metal oxide to serve as the gate dielectric. To achieve this structure a relatively easily anodized gate metal is preferred, such as aluminum (Al) or tantalum (Ta), resulting in the metal oxide AlO or TaO. It should be noted that it is hard to form a via on the anodized metal oxide because it is hard to etch the oxide without etching the underlying metal. To solve this problem a patterning mask is used during the anodization process, as described below.

Referring specifically to FIG. 7, a substrate 50 is provided which may be any material desired for the specific application, e.g. plastic, glass, etc. As a first step in the preferred process, gate metal layer 52 and barrier metal layer 54 are deposited on the upper surface of substrate 50 and patterned to form a gate for each of the two TFTs in an AMOLED element. The patterning of gate metal layer 52 and barrier metal layer 54 requires the first mask level.

Gate metal layer 52 used for anodization in the present process is usually reactive so it is easily anodized. Thus, it may become corrosive with the overlaying metal oxide, such as ITO, under an electrical field. To compensate for this problem a barrier metal which is less reactive such as Mo, W, Cr, or Ni, is provided to prevent corrosion due to electrochemical reactions. The gate metal is covered with the barrier metal.

Figure 9:
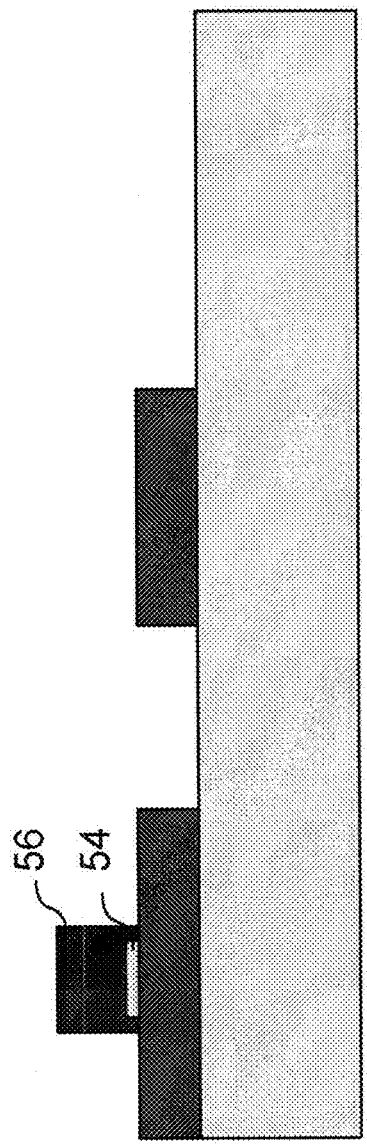
Figure 10:
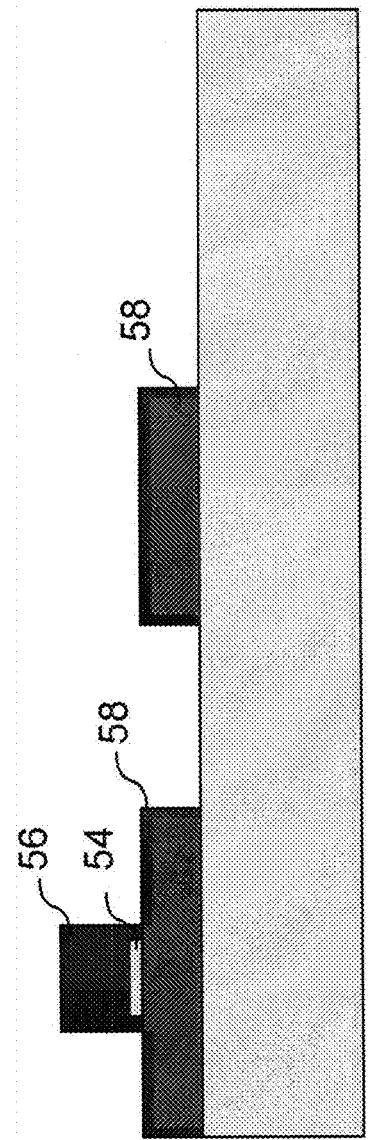
Figure 11:
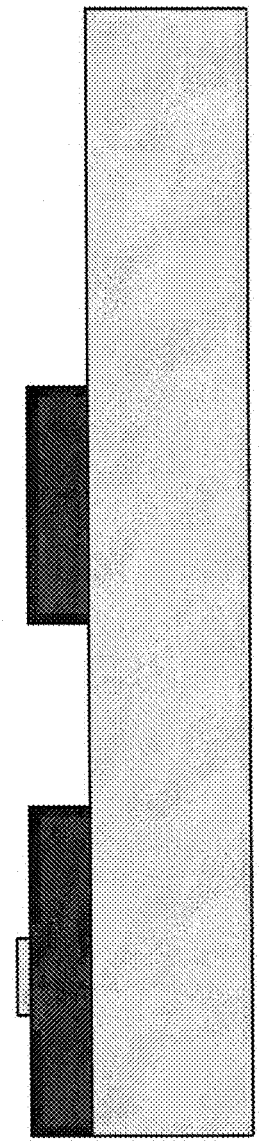

Referring to FIG. 8, a patterning mask 56, such as a photoresist or the like, is formed on the surface of barrier metal layer 54 at the position desired for the via. The gate pattern is defined by photolithography in the present process. Using mask 56, barrier metal layer 54 is etched to remove the layer except for a via. In this preferred process the etching undercuts mask 56 slightly. As illustrated in FIG. 9, patterning mask 56 is then reflowed slightly to cover not only the upper surface of barrier metal layer 54 but also the sides. The reflow may be accomplished, for example, by heat, light or any feature that slightly softens patterning mask 56. As illustrated in FIG. 10, gate metal layer 52 is subjected to anodization to from a layer 58 of anodized or oxidized gate metal. As understood by those skilled in the art, an active metal, such as aluminum or tantalum is easily anodized by subjecting it to a water vapor, such as steam or the like. The area covered by patterning mask 56 is not anodized and there is no oxide underneath via 54. After the desired amount of anodization occurs, the process is stopped and patterning mask 56 is removed in any well known manner, as illustrated in FIG. 11.

In this process the via surface is the barrier metal which does not have any electrochemical reaction with overlying metal oxide. Also, native oxide is difficult to form on the barrier metal and via contact resistance is greatly improved without requiring any back sputtering, etching, or other cleaning processes. Thus two spaced apart gates are formed with a via defined on one of the gates. Once fabrication of the via is completed the process can proceed as described above. The via serves to connect the gate metal on which it is positioned to any overlying conductor.

Thus, a new and improved fabrication process for AMLCDs and AMOLEDs is disclosed in which the number of mask levels is reduced. Also, a substantial improvement in the formation process for vias in AMOLEDs is disclosed. By reducing the number of masks or masking steps required, the process is substantially simplified and, consequently, the cost is reduced. Specifically, the present invention discloses a process of forming banks or spacers with a reduced number of masks and for forming vias through, for example, an anodized gate insulator. The reduced mask process and via forming process can be used to fabricate bus-lines and contact pads in peripheral areas which, for example, connect the active display with column and row driving circuits. Integrated scan drivers and data drivers can also be made with the present TFT process and the via forming process. The process disclosed in this invention can thus be used to fabricate display backpanels with integrated column and row drivers.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a thin film transistor and transparent light transmission area for an active matrix display with reduced masking operations, the method comprising the steps of:
    providing a transparent substrate with a surface;
    patterning gate metal on the surface of the substrate to define a thin film transistor gate;
    forming a layer of transparent gate dielectric over the gate and surrounding substrate surface;
    depositing a layer of transparent semiconducting metal oxide on the layer of gate dielectric;
    patterning a channel protection layer on the semiconducting metal oxide overlying the gate, the channel protection layer being patterned to define a channel area in the semiconducting metal oxide above the gate and to expose the remaining semiconducting metal oxide;
    depositing at least a source/drain metal layer on the channel protection layer and the exposed semiconducting metal oxide;
    in a single etching step, etching through the source/drain metal layer to the channel protection layer above the gate to separate the source/drain metal layer into thin film transistor source and drain terminals and etching through the source/drain metal layer and the semiconducting metal oxide at the periphery to isolate the thin film transistor;
    patterning a nonconductive spacer layer on the isolated thin film transistor and portions of the surrounding source/drain metal layer, the spacer layer defining a light transmission area adjacent the channel area designed to receive a light transmitting device in overlying relationship; and
    using the patterned nonconductive layer as a mask etching through the source/drain metal layer in the light transmission area to expose the semiconducting metal oxide as a transparent pixel terminal contacting or forming one terminal of the overlying light transmitting device.

2. A method as claimed in claim 1 wherein the fabrication of the thin film transistor includes fabricating a plurality of thin film transistors in an active matrix display, the active matrix display including a matrix of data lines and scan lines with the gate metal being connected to one of the scan lines and the source/drain metal being connected to one of the data lines.

3. A method as claimed in claim 1 wherein the light transmitting device includes one of a liquid crystal device (LCD) and an organic light emission device (OLED).

4. A method as claimed in claim 1 wherein the spacer layer is positioned to separate the substrate and associated components formed thereon from adjacent substrate formations in the active matrix display.

5. A method as claimed in claim 1 wherein the step of depositing at least a source/drain metal layer includes depositing a layer of transparent oxide on the channel protection layer and the exposed semiconducting metal oxide prior to depositing the source/drain metal layer.

6. A method as claimed in claim 5 wherein the step of depositing at least a source/drain metal layer includes depositing a barrier metal layer on the layer of transparent oxide.

7. A method as claimed in claim 6 wherein the step of depositing the barrier metal layer includes depositing one of Mo, W, Cr, and Ni.

8. A method of fabricating a matrix of thin film transistors in an active matrix display, the active matrix display including a matrix of data lines and scan lines, the method comprising the steps of:
    providing a transparent substrate with a surface;
    patterning gate metal on the surface of the substrate to define a gate for each thin film transistor of the matrix, and connecting the gate of each thin film transistor of the matrix to a selected scan line;
    forming a layer of transparent gate dielectric over each of the gates and surrounding substrate surface;
    depositing a layer of transparent semiconducting metal oxide on the layer of gate dielectric;
    patterning a channel protection layer on the semiconducting metal oxide overlying each gate, the channel protection layer being patterned to define a channel area in the semiconducting metal oxide above each gate and to expose the remaining semiconducting metal oxide;
    depositing at least a source/drain metal layer on the channel protection layer and the exposed semiconducting metal oxide;
    in a single etching step, etching through the source/drain metal layer to the channel protection layer above each gate to separate the source/drain metal layer into thin film transistor source and drain terminals and etching through the source/drain metal layer and the semiconducting metal oxide at the periphery to isolate each thin film transistor of the matrix, and connecting each of the source/drain terminals to one of the data lines;
    patterning a nonconductive spacer layer on the isolated thin film transistor and portions of the surrounding source/drain metal layer, the spacer layer defining a light transmission area adjacent the channel area designed to receive a light transmitting device in overlying relationship; and
    using the patterned nonconductive layer as a mask etching through the source/drain metal layer in the light transmission area to expose the semiconducting metal oxide as a transparent pixel terminal.

9. A method as claimed in claim 8 wherein the transparent pixel terminal in the light transmission area is an electrode of a light emission device in the active matrix display.

10. A method as claimed in claim 9 wherein the light emission device includes one of a liquid crystal emission device (LCD) and an organic light emission device (OLED).

11. A method as claimed in claim 9 wherein the spacer layer is positioned to separate the substrate and associated components formed thereon from adjacent substrate formations in the active matrix display.

12. A method as claimed in claim 8 wherein the step of depositing at least a source/drain metal layer includes depositing a layer of transparent oxide on the channel protection layer and the exposed semiconducting metal oxide prior to depositing the source/drain metal layer.

13. A method as claimed in claim 12 wherein the step of depositing at least a source/drain metal layer includes depositing a barrier metal layer on the layer of transparent oxide.

14. A method as claimed in claim 13 wherein the step of depositing the barrier metal layer includes depositing one of Mo, W, Cr, and Ni.

* * * * *